(12) United States Patent
Wakita et al.

(10) Patent No.: US 7,633,221 B2
(45) Date of Patent: Dec. 15, 2009

(54) ORGANIC LIGHT-EMITTING DEVICE WITH MEANDERING ELECTRODE SURFACE, AND METHOD FOR MANUFACTURING SAME

(75) Inventors: Naohide Wakita, Suita (JP); Seiji Nishiyama, Hirakata (JP)

(73) Assignee: Panasonic Corporation, Osaka (JP)

( * ) Notice: Subject to any disclaimer, the term of this patent is extended or adjusted under 35 U.S.C. 154(b) by 418 days.

(21) Appl. No.: 10/565,907

(22) PCT Filed: Aug. 5, 2003

(86) PCT No.: PCT/JP03/09961

§ 371 (c)(1),
(2), (4) Date: Jan. 25, 2006

(87) PCT Pub. No.: WO2005/013645

PCT Pub. Date: Feb. 10, 2005

(65) Prior Publication Data

US 2006/0214563 A1    Sep. 28, 2006

(51) Int. Cl.
*H05B 33/00* (2006.01)
(52) U.S. Cl. .................. 313/506; 313/504; 428/690; 428/917; 445/24
(58) Field of Classification Search .......... 313/506, 313/504; 428/690, 917; 445/24
See application file for complete search history.

(56) References Cited

U.S. PATENT DOCUMENTS

| | | | |
|---|---|---|---|
| 6,433,487 B1 * | 8/2002 | Yamazaki | 315/169.3 |
| 6,881,501 B2 * | 4/2005 | Yudasaka | 428/690 |
| 7,038,373 B2 * | 5/2006 | Arnold et al. | 313/506 |
| 7,071,617 B2 * | 7/2006 | Utsumi et al. | 313/506 |
| 7,312,571 B2 * | 12/2007 | Kim | 313/506 |
| 2001/0033136 A1 | 10/2001 | Kawase | 313/506 |
| 2001/0038102 A1 | 11/2001 | Kawase | 257/98 |
| 2002/0079835 A1 | 6/2002 | Lee | 313/506 |
| 2002/0101155 A1 * | 8/2002 | Kimura | 313/506 |
| 2003/0062520 A1 | 4/2003 | Toguchi et al. | 257/40 |
| 2003/0117067 A1 * | 6/2003 | Roitman et al. | 313/504 |

FOREIGN PATENT DOCUMENTS

EP    1 081 767    3/2001

(Continued)

*Primary Examiner*—Sikha Roy
(74) *Attorney, Agent, or Firm*—Steptoe & Johnson LLP

(57) ABSTRACT

An organic electroluminescent element has a substrate, a first electrode formed above the substrate, an emissive layer, and a second electrode formed above the emissive layer. In the first electrode, at least a surface opposite to the other surface facing the substrate has a multidimensionally meandering surface shape. The emissive layer includes an organic electroluminescent material and is formed along the multidimensionally-meandering-shaped surface of the first electrode. In the emissive layer, a surface facing the first electrode and the other surface opposite to the first-electrode-facing surface each have a multidimensionally meandering surface shape. The organic electroluminescent element of the present invention is used in an electroluminescent (EL) type display device as a pixel that is controlled individually for light emission. Also, the organic electroluminescent element of the present invention is used as a light source of an electroluminescent (EL) type lighting system. As a result, an organic electroluminescent element with high luminance and an organic electroluminescent element with a long lifetime are provided, and an EL display device and an EL lighting system using such elements are provided.

8 Claims, 11 Drawing Sheets

FOREIGN PATENT DOCUMENTS

| | | |
|---|---|---|
| JP | 5-3079 | 1/1993 |
| JP | 8-185983 | 7/1996 |
| JP | 9-7768 | 1/1997 |
| JP | 10-172767 | 6/1998 |
| JP | 2001-338757 | 12/2001 |
| JP | 2003-122303 | 4/2003 |
| JP | 2003-257662 | 9/2003 |

* cited by examiner

ORGANIC LIGHT-EMITTING DEVICE WITH MEANDERING ELECTRODE SURFACE, AND METHOD FOR MANUFACTURING SAME

TECHNICAL FIELD

The present invention relates to organic electroluminescent elements, display devices and lighting systems using such organic electroluminescent elements. More particularly, the invention relates to the shape of an emissive layer in an organic electroluminescent element.

BACKGROUND ART

Organic electroluminescent elements (organic EL elements) are viewed as the promising display elements of the next generation in that such elements operate at a voltage of as low as 10 volts or less, are capable of realizing various colors emitted by using organic compounds of different connective structures, and have high electroluminescent efficiency. In recent years, with the development of organic electroluminescent elements, their luminance and electroluminescent efficiency have become applicable to display devices.

Typical fabrication methods of such organic electroluminescent elements include a step of forming by the sputtering technique a transparent electrode (anode) having a flat surface above a substrate of glass or the like, a step of forming above the transparent electrode an emissive layer containing an organic electroluminescent material, and a step of forming by evaporation a metal electrode (cathode) such as magnesium and calcium above the emissive layer. In this fabrication method, if the electroluminescent material for the emissive layer is not a polymer (also referred to as a low-molecular electroluminescent material), the technique of evaporation is employed in forming the emissive layer. If, on the other hand, the electroluminescent material therefor is a polymer (also referred to as a polymer electroluminescent material), a solution containing the electroluminescent material is applied to form the emissive layer.

Conventionally, in organic electroluminescent elements, to increase luminance and electroluminescent efficiency, improvements have been made to the organic electroluminescent materials, or structural improvements have been made including provision of a function layer other than the electroluminescent material layer between the anode and cathode. The following describes an example of the lamination structure known in the art. Known emissive layers whose materials are polymeric and electroluminescent include those that have a two-layer structure of an electroluminescent material layer and a hole-transfer layer provided between the electroluminescent material layer and the anode. Known emissive layers whose materials are low-molecular and electroluminescent include those that have a three-layer structure of a electroluminescent material layer, a hole-transfer layer provided between the electroluminescent material layer and the anode, and an electron-transport layer provided between the electroluminescent material layer and the cathode. Other organic electroluminescent elements under development are those in which the emissive layer has a four-or-more-layer structure of function layers provided between the anode and cathode.

The principle of light emission of an organic EL element requires the injection of carriers (electrons and holes) (injection of current) into the emissive layer, which easily causes the decomposition of the organic compound composing the emissive layer and chemical or physical degradation of the boundary between the emissive layer and another layer. Thus, it is not easy to increase the lifetime of organic EL elements as compared with laser emitting diodes (LEDs), which employ inorganic materials for the emissive layer. The increase of luminance requires an increase in an operation voltage applied to the element. The greater the operation voltage is applied, the shorter the lifetime of the element becomes. Thus, it has been practically impossible to apply conventional organic electroluminescent materials and organic electroluminescent elements of conventional constructions to television, which requires high luminance, and to lighting systems, which require extremely high luminance.

DISCLOSURE OF THE INVENTION

In view of the foregoing and other problems, it is a first object of the present invention to increase the luminance and/or lifetime of an organic electroluminescent element by structurally improving it. It is a second object of the present invention to provide a fabrication method of an organic electroluminescent element with high luminance and/or an extended lifetime. It is a third object of the present invention to provide a display device with high luminance and/or an extended lifetime. It is a fourth object of the present invention to provide a lighting system with high luminance and/or an extended lifetime.

In the present specification, embodiments have been divided into a first invention group and a second invention group so that each invention group has closely related embodiments. The following describes the details of each section (invention group).

First Invention Group

According to a first invention group, there is provided an organic electroluminescent element comprising a substrate, a first electrode formed above the substrate, an emissive layer, and a second electrode formed above the emissive layer. In the first electrode, at least a surface opposite to the other surface facing the substrate has a multidimensionally meandering surface shape. The emissive layer includes an organic electroluminescent material and is formed along the multidimensionally-meandering-shaped surface of the first electrode. In the emissive layer, a surface facing the first electrode and the other surface opposite to the first-electrode-facing surface each have a multidimensionally meandering surface shape.

This construction, where the emissive layer is formed along the surface of the first electrode having a multidimensionally meandering surface shape, increases the per unit effective light emitting area of the organic electroluminescent element, thus increasing the luminance thereof. This construction also decreases an operation voltage for maintaining the luminance of light extracted from a conventional organic electroluminescent element, thus increasing the lifetime thereof. The term "per unit effective light emitting area" denotes the area of the light emitting surface of the emissive layer. The term "multidimensionally" denotes "two-dimensionally" or "three-dimensionally." A two-dimensionally meandering surface shape is such that a cut section perpendicular to the substrate meanders in a way that corresponds to the meandering shape of any cut section parallel to the cut section. A three-dimensionally meandering surface shape is such that a sectional surface perpendicular to the substrate meanders in a way that differs from the meandering shape of any sectional surface parallel to the sectional surface. The way the cut section meanders may be like a serrated line as well as like a curved line. The meandering way includes an irregular or random shape, and a regular, geometric shape such as a crank shape.

In the organic electroluminescent element according to the first invention group, the thickness of the emissive layer may be approximately uniform. This construction, while increasing the effective light emitting area, makes a potential difference in the emissive layer approximately uniform, preventing a local deterioration in the emissive layer. Thus, the luminance of the organic electroluminescent element extremely increases or the lifetime thereof extremely increases.

In the organic electroluminescent element according to the first invention group, the multidimensionally meandering surface of the first electrode, which surface is opposite to the other surface facing the substrate, may be such that a section perpendicular to the substrate includes an indented shape, and that the emissive layer is formed approximately uniformly along the indented shape. This construction, where the emissive layer is formed approximately uniformly along the indented shape formed in a complicated manner on the surface of the first electrode, makes a potential difference in the emissive layer approximately uniform, as well as increasing the per unit effective light emitting area in the organic electroluminescent element. Thus, the luminance of the organic electroluminescent element further extremely increases or the lifetime thereof further extremely increases.

The term indented shape included in a section of the multidimensionally meandering surface, which section is perpendicular to the substrate, is such that a section perpendicular to the substrate bends in a winding way and in a direction other than the direction perpendicular to the substrate. This winding shape may be like a serrated line as well as like a curved line. For convenience of description, any opening hole that includes a portion that range in a direction other than the direction perpendicular to the substrate will be hereinafter referred to as an indented hole. This indented hole includes a depression with a bottom and a penetrating hole without a bottom.

In the organic electroluminescent element according to the first invention group, the surface of the second electrode, which surface is on the side of the emissive layer, may have a multidimensionally meandering surface shape. This construction makes the second electrode formed in accordance with the shape of the surface of the emissive layer, and thus prevents the concentration of electric fields that depends on the surface shapes of the first and second electrodes. This increases the luminance of the effective light emitting portion of the organic electroluminescent element and keeps the luminance from depending on the portion to emit light. Further, the organic electroluminescent element according to the first invention group may be such that in each of six pairs of cut sections of the organic electroluminescent element resulting from three ways of cutting thereof, the actual length of the meandering-shaped line of the emissive layer and a projected length of the meandering-shaped line meet Inequality 1 shown below. The three ways of cutting are perpendicular to the substrate and cross each other at an angle of 60 degrees and at an arbitrary intersection point on the substrate. The projected length of the meandering-shaped line is the length of the meandering-shaped line projected onto a plane parallel to the substrate and projected from a direction perpendicular to the substrate.

$$\frac{\sum_{n=1}^{6}\left(\begin{array}{c}\text{actual length of meandering}\\ \text{shaped line of } nth \text{ cut section}\end{array}\right)}{\frac{(\text{its projected length})}{6}} \geq 2 \quad (1)$$

The left part of Inequality (1) is twice as large, preferably three times as large, more preferably five times as large, and further more preferably ten times as large, and particularly preferably twenty times as large as the right part. This construction realizes a stable and remarkable increase in the per unit effective light emitting area of the organic electroluminescent element, as compared with the case where a flat substrate or a coarse substrate is simply used. Thus, the luminance of the organic electroluminescent element extremely increases or the lifetime thereof extremely increases.

A method of fabricating the organic electroluminescent element according to the first invention group comprises: a first electrode forming step for forming, above the substrate, a first electrode so that the surface of the first electrode, which surface is opposite to the other surface facing the substrate, has a multidimensionally meandering surface shape; an emissive layer forming step of forming an emissive layer whose both surfaces each have a multidimensionally meandering surface shape by depositing an organic electroluminescent material approximately uniformly along the multidimensionally meandering surface of the first electrode, one surface of the emissive layer facing the first electrode, the other surface of the emissive layer being opposite to the one surface facing the first electrode; and a second electrode forming step of forming a second electrode above the emissive layer.

In the emissive layer forming step, the organic electroluminescent material is deposited approximately uniformly along the first electrode whose surface opposite to the other surface facing the substrate has a multidimensionally meandering surface shape so that the emissive layer formed is uniform and bends in a complicated and winding manner. This construction, while increasing the effective light emitting area, makes a potential difference in the emissive layer approximately uniform. As a result, the luminance of the organic electroluminescent element thus fabricated extremely increases or the lifetime thereof extremely increases. In this emissive layer forming step, to form an approximately uniformly thick emissive layer, the techniques of electrolytic deposition or adsorption may be used.

Second Invention Group

A display device according to a second invention group of the present invention comprises a substrate, an electronic circuit formed on the substrate, and at least one organic electroluminescent element. The light emission of the organic electroluminescent element is controlled via the electronic circuit. The organic electroluminescent element comprises a substrate, a first electrode formed above the substrate, an emissive layer, and a second electrode formed above the emissive layer. In the first electrode, at least a surface opposite to the other surface facing the substrate has a multidimensionally meandering surface shape. The emissive layer includes an organic electroluminescent material and is formed along the multidimensionally-meandering-shaped surface of the first electrode. In the emissive layer, a surface facing the first electrode and the other surface opposite to the first-electrode-facing surface each have a multidimensionally meandering surface shape.

With this construction, light emission is controlled at a low voltage, and the pixel obtained is composed of a highly durable organic electroluminescent element and is controlled individually for light emission. This realizes an EL type display device that is driven at a low voltage and is highly durable.

A lighting system according to the second invention group of the present invention comprises a substrate, a voltage application wire formed on the substrate, and at least one organic electroluminescent element electrically connected with the voltage application wire. The organic electroluminescent element comprises a substrate, a first electrode formed above the substrate, an emissive layer, and a second electrode formed above the emissive layer. In the first electrode, at least a surface opposite to the other surface facing the substrate has a multidimensionally meandering surface shape. The emissive layer includes an organic electroluminescent material and is formed along the multidimensionally-meandering-shaped surface of the first electrode. In the emissive layer, a surface facing the first electrode and the other surface opposite to the first-electrode-facing surface each have a multidimensionally meandering surface shape.

This construction provides an organic electroluminescent element excellent in luminance and durability, and thus realizes a highly durable EL type display device with high luminance.

BEST MODE FOR CARRYING OUT THE INVENTION

Embodiments of First Invention Group

The following describes the contents and preferred embodiments of the first invention group of the present invention.

Figure 1:
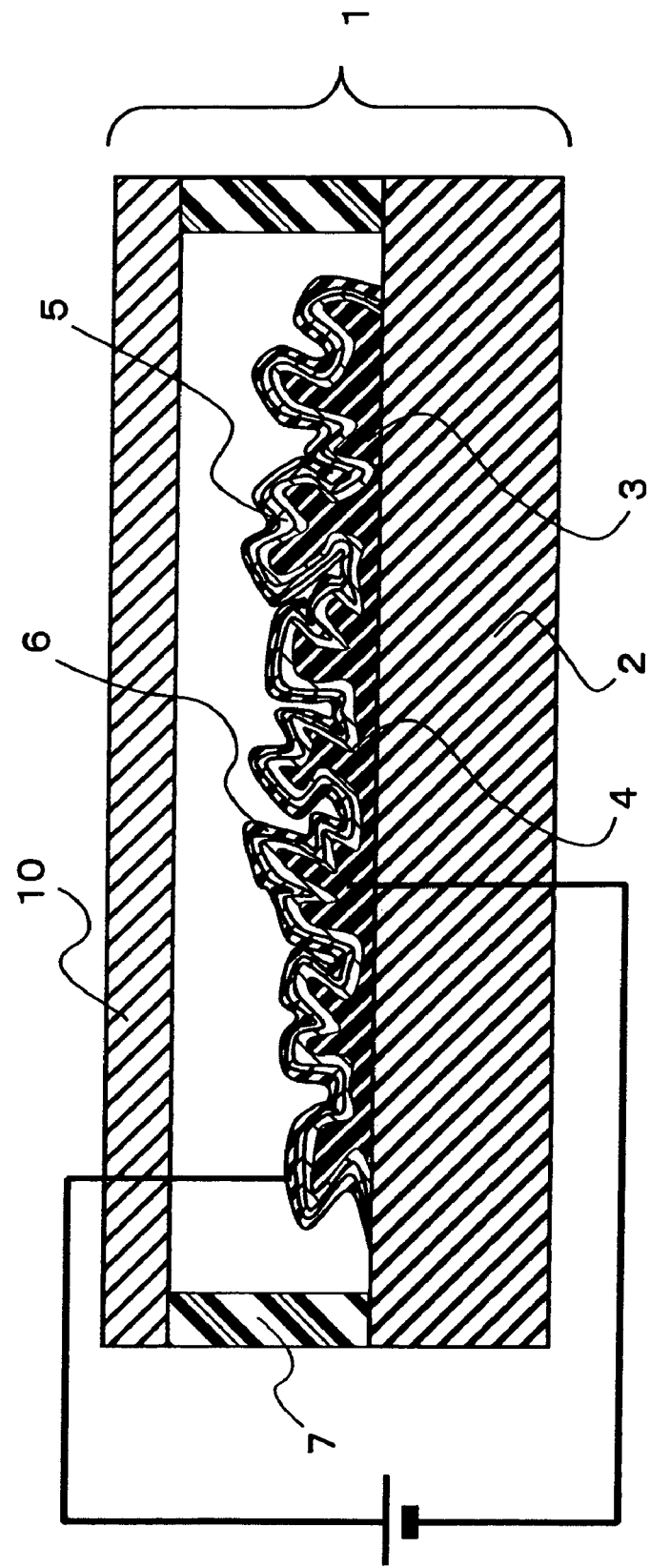
FIG. 1 is a schematic section of an organic electroluminescent element according to an example of the present invention.
Figure 2:
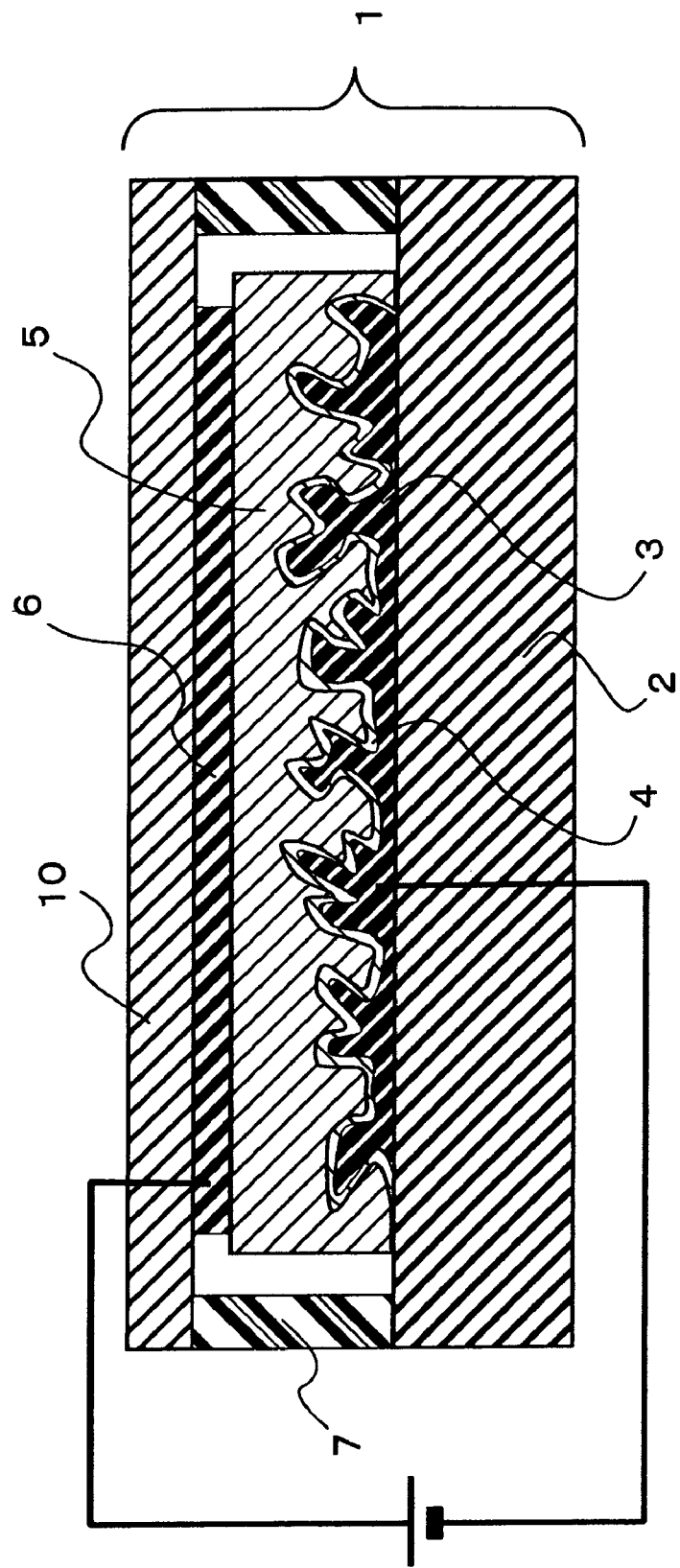
FIG. 2 is a schematic section of an organic electroluminescent element according to another example of the present invention.

An organic electroluminescent element that is the embodiment of the first invention group of the present invention, and a method of fabricating thereof will be described with reference to FIG. 1. FIG. 1 is a section of an organic electroluminescent element 1 according to the present invention.

<Formation of First Electrode>

A first electrode having a multidimensionally meandering surface shape was formed in any of the following methods (A)-(D). It should be noted that the formation method of the first electrode is not limited to the following examples.

(A) A metal was dissolved and solidified in an inert gas atmosphere by using a high-voltage/high-frequency dissolving device in accordance with modified Czochralski processing. Thus, the surface of the lump of metal was processed into a multidimensionally meandering surface shape (detailed later). This method is described as follows. In an atmosphere of an inert gas such as nitrogen (pressure: 101324.72 Pa), a low work function metal or an alloy containing such metal was dissolved in the crucible of the device. Examples of the low work function metal include: single metals made of alkali metals such as lithium, alkaline-earth metals such as magnesium and calcium, or rare-earth metals such as europium; and alloys of these metals and aluminum, silver, or indium. Subsequently, the temperature was raised to the eutectic point of the inert gas and the metal used, thus introducing the inert gas into the metal. Further, the pressure inside the device was raised. Then, out of the crucible of the device, the metal of several tens to several hundreds of micrometers thick was pulled at a rate of 0.1 mm/sec to 1 mm/sec. Subsequently, the metal was fixed by removing coldness out of it through natural radiational cooling. The inert gas blows out of the metal and leaves the traces of blowing, thus processing the surface of the metal into a multidimensionally meandering surface shape.

(B) A removable fiber was mixed in a lump of metal and then removed. Thus, the surface of the lump of metal was processed into a multidimensionally meandering surface shape. This method is described as follows. A removable fiber was mixed in the above-mentioned low work function metal in the form of, for example, powder together with a polymer fixing agent such as polyacrylamide, thus preparing a mixture of several tens to several hundreds of micrometers thick. Examples of the removable fiber include fibers that are removed by high temperature heating such as pulp, natural fibers, and synthesized fibers. This mixture was heated, and thus the removable fiber was removed and the metal powder was sintered. The removed fiber left its traces in the metal lump, thus processing the surface of the metal into a multidimensionally meandering surface shape.

(C) The surface of a lump of metal was processed into a multidimensionally meandering surface shape by etching the surface of a lump of metal. This method is described as follows. A conductive film (several tens to several hundreds of micrometers thick) made of the above-mentioned low work function metal such as calcium metal was formed on the substrate by techniques such as vacuum evaporation, sputtering, and CVD (Chemical Vapor Deposition). The surface of this conductive film was dry-etched by using, as a mask, a resist film having a multiplicity of fine penetrating holes and shielding portions in which light permeability varied on a continuous or phased basis. Thus, the surface of the metal was processed into a two-dimensionally meandering surface shape or a three-dimensionally meandering surface shape. Thus, the first electrode having a multidimensionally meandering surface shape was formed.

Figure 3:
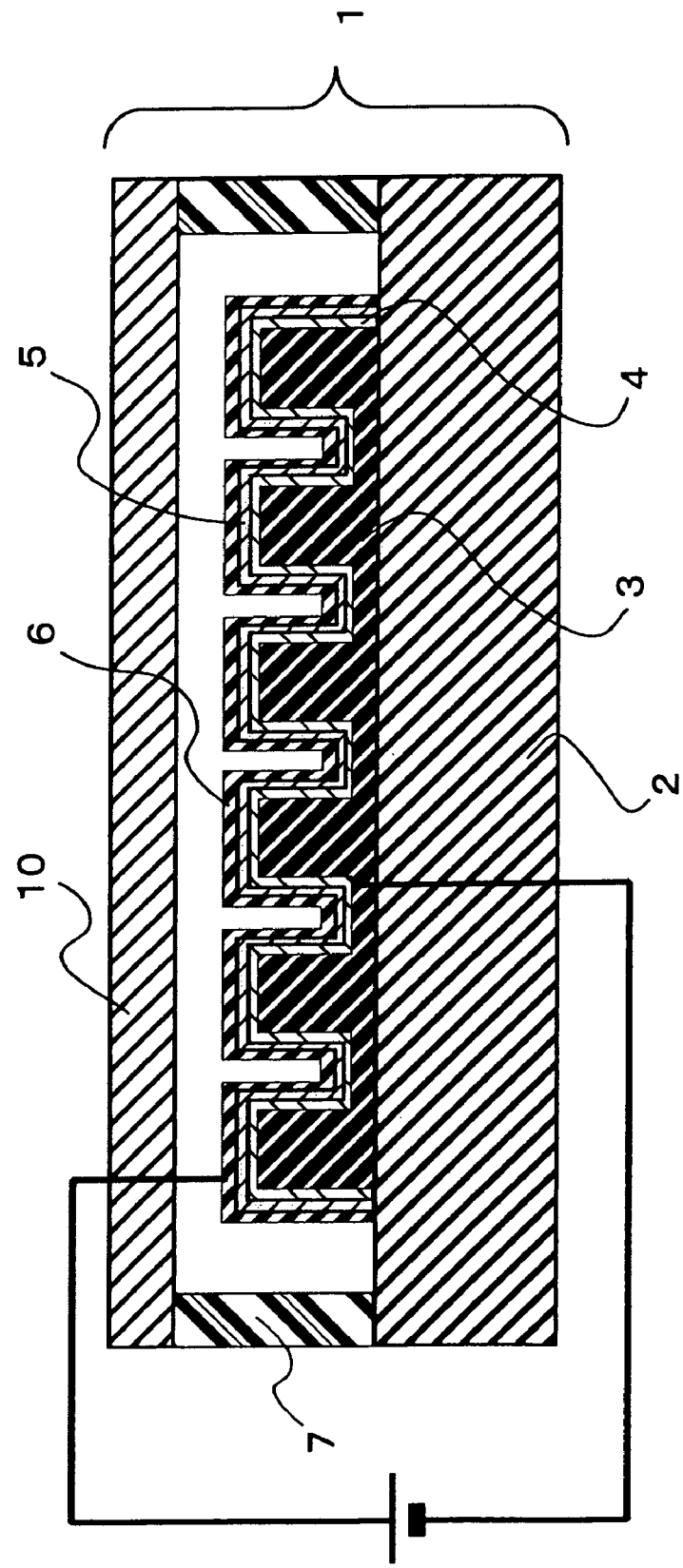
FIG. 3 is a schematic section of an organic electroluminescent element according to another example of the present invention.
Figure 4:
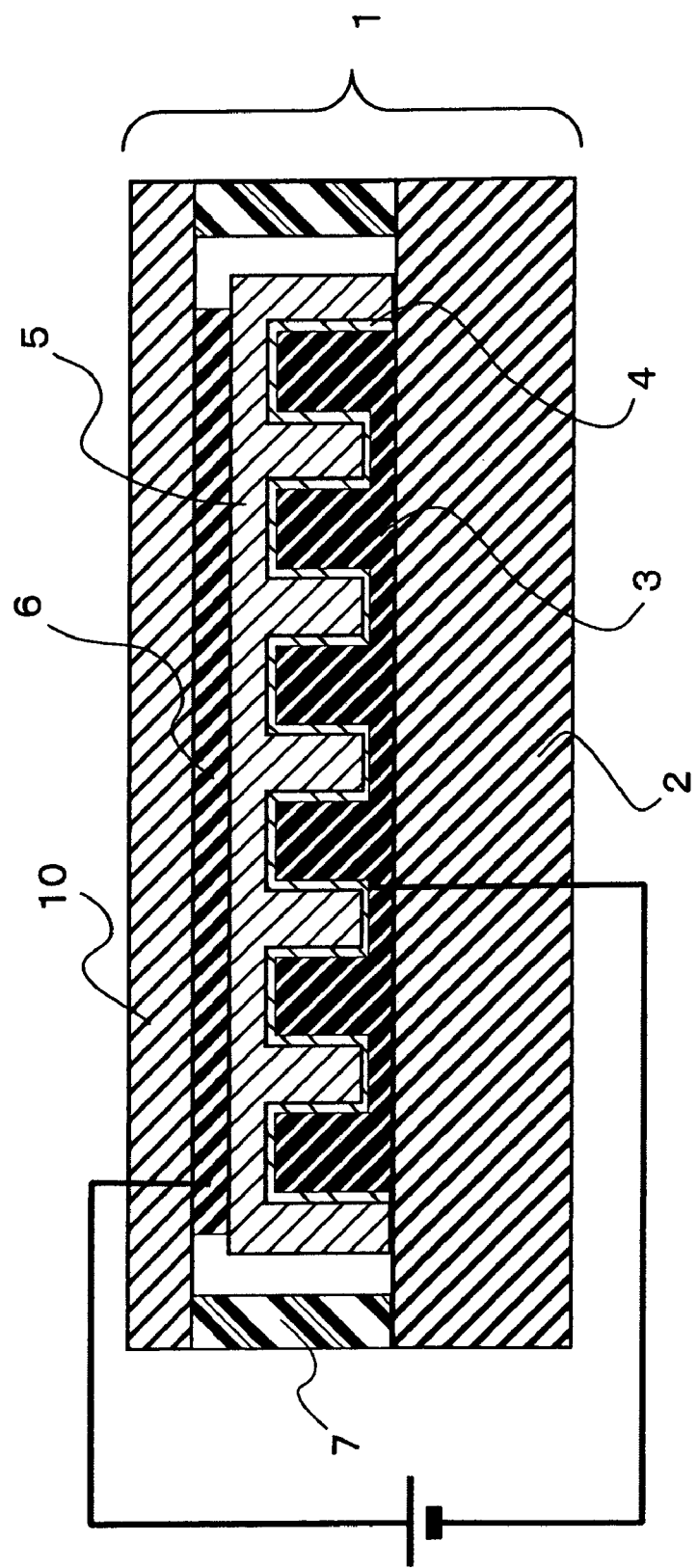
FIG. 4 is a schematic section of an organic electroluminescent element according to another example of the present invention.

The etching of the surface of the conductive film in the manner described above causes formation of, on a first electrode 3, a meandering-shaped surface depressed in the direction approximately perpendicular to the substrate, as shown in FIGS. 3 and 4. For the effective light emitting area of the organic electroluminescent element to increase remarkably, it is preferable that the depth of the depressed portion be longer than the maximum opening width of the depressed portion. For example, when the opening end of the depressed portion is a square or a circle, the depth of the depressed portion is preferably longer than one side of the square or the diameter of the circle. Specifically, in a conductive film of several tens to several hundreds of micrometers thick, the opening hole preferably has a square opening end of several hundreds to thousands nanometers long for each side or has a circular opening end of several hundreds to thousands nanometers in diameter.

Figure 5:
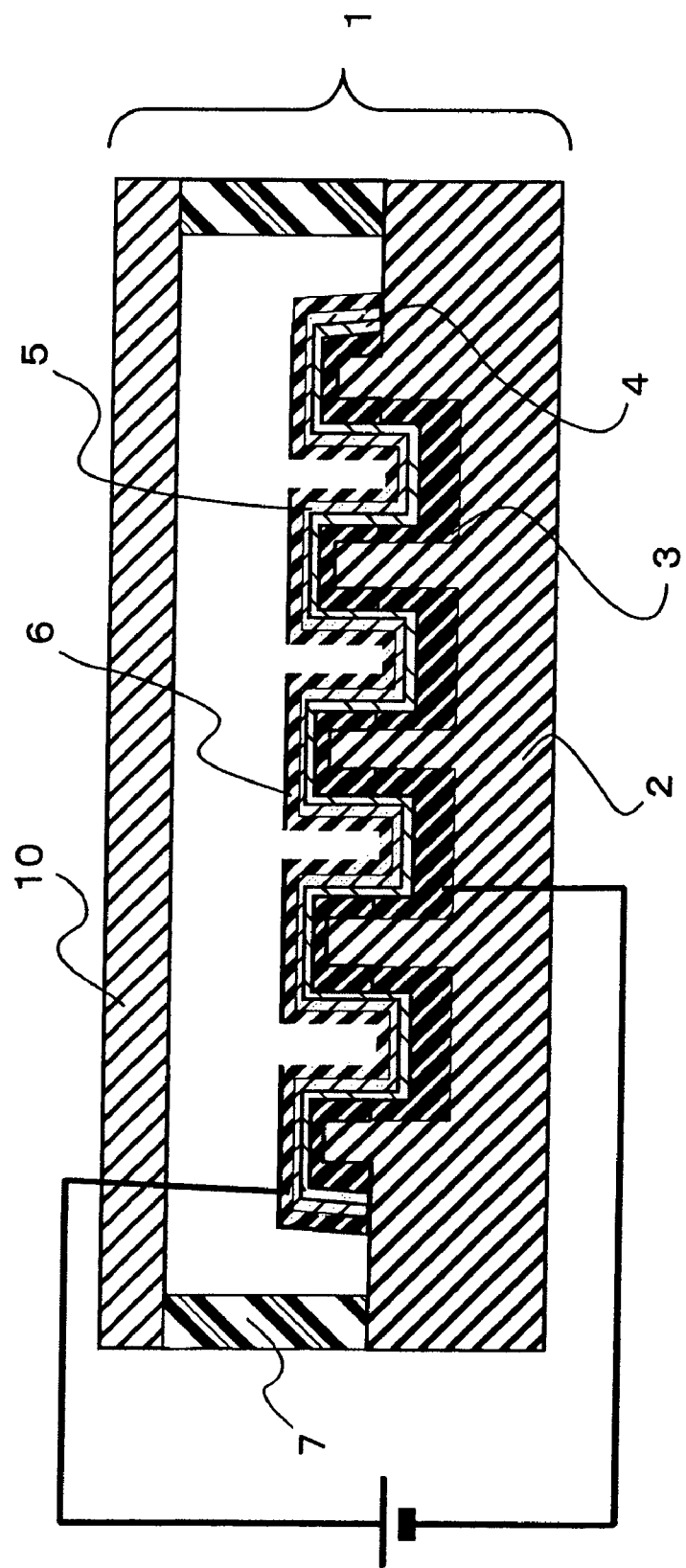
FIG. 5 is a schematic section of an organic electroluminescent element according to another example of the present invention.
Figure 6:
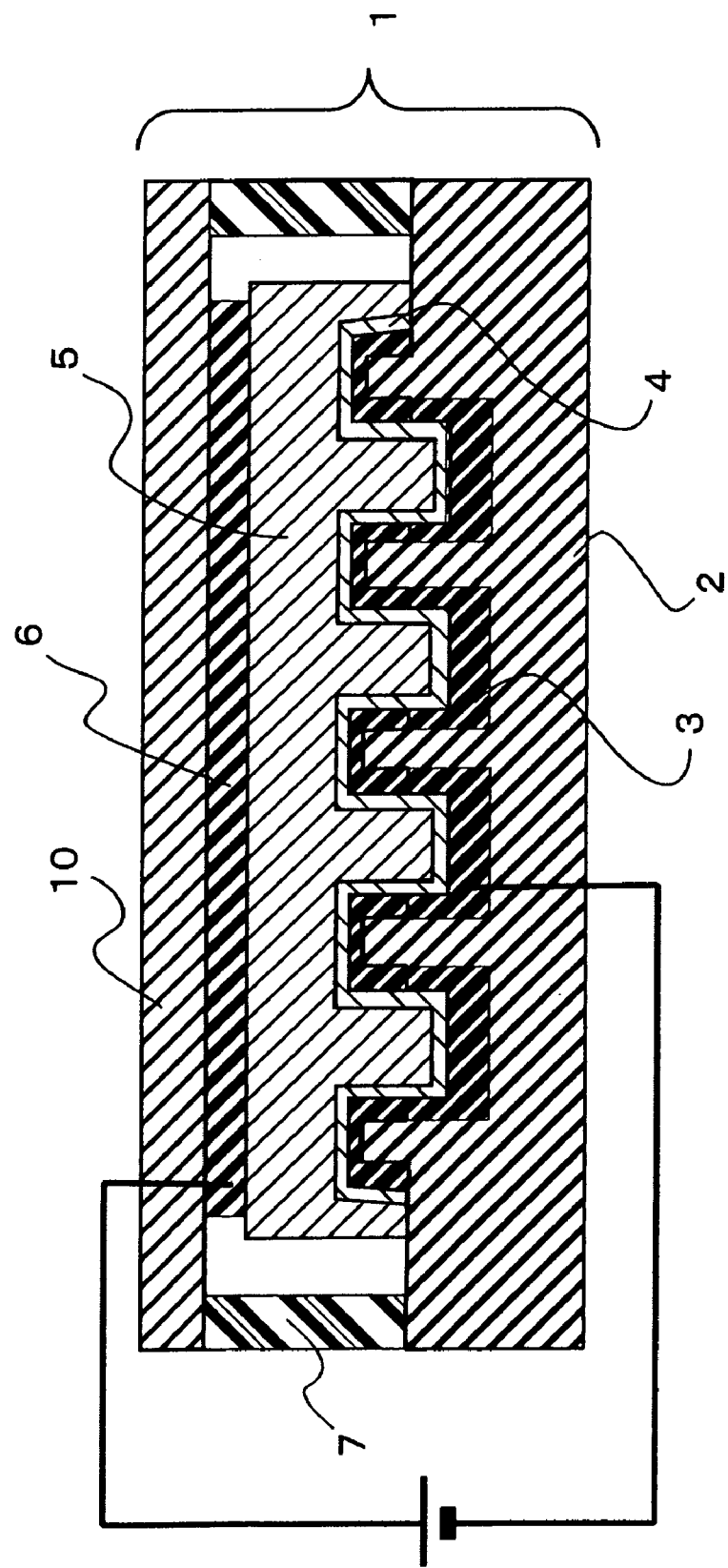
FIG. 6 is a schematic section of an organic electroluminescent element according to another example of the present invention.

In the first electrode 3, as shown in FIGS. 5 and 6, it is of course possible that a multidimensionally meandering surface shape be formed not only on the surface opposite to the other surface facing the substrate, but also on the surface facing the substrate. In this case, the substrate surface is in advance formed into a multidimensionally meandering surface shape by dry etching, and the first electrode is deposited above the surface. The surface shape of the first electrode can be further processed by dry etching with a resist film in the manner described above.

(D) The first electrode having a multidimensionally meandering surface shape was formed by the technique of pressure forming with a finely powdered metal. This method is described as follows. In a vacuum, powdered calcium (conductive powder) with a volume average particle size of 5 μm was deposited on a substrate 2. The deposited powdered calcium was subjected to press processing and was integrated, thus forming an electrode 3 (first electrode) having a multidimensionally meandering surface shape and made of calcium. In forming the first electrode, the pressure of the presswork was set at approximately $9.8 \times 10^2$ kPa ($10$ kgf/cm$^2$) so that the density of the first electrode was 0.1 g/cm$^2$ to 0.8 g/cm$^2$.

[Confirmation of Multidimensionally Meandering Surface Shape of First Electrode]

The first electrode 3 formed in the above manner has been confirmed to have on its surface a two-dimensionally or three-dimensionally meandering surface shape that is defined below. This confirmation was conducted by using a SEM (Scanning Electron Microscope) that observed the surface opposite to the substrate-facing surface of the first electrode 3. It also has been confirmed that the surface observed included a meandering shape meandering in an indented manner. As noted above, it is essential that the surface of the first electrode 3 have a two-dimensionally or three-dimensionally meandering surface shape, and as long as such shape is realized, the method of preparing the first electrode 3 is not limited to the above four methods. For example, a multidimensionally meandering surface shape can be formed in the following methods. On the surface of a conductive metal film, which is the main constituent of the first electrode, another metal having a different characteristic of oxidation is scattered and deposited by the technique of sputtering, followed by anodic oxidation. Another method is such that on the above conductive metal film, an oxidation protecting film is dispersed just as forming islands and subjected to anodic oxidation, and finally the oxidation protecting film is removed by cleansing it with an adequate solvent.

As described above, the term "two-dimensionally meandering surface shape" denotes such a shape that its cut section perpendicular to the substrate meanders in a way that corresponds to the meandering way of any cut section parallel to the cut section. The term "three-dimensionally meandering surface shape" denotes such a shape that its cut section perpendicular to the substrate meanders in a way that differs from the meandering way of any cut section parallel to the cut section. The term "a meandering surface has an indented shape" denotes such a shape that its cut section perpendicular to the substrate meanders in a direction other than the direction perpendicular to the substrate. This meandering way may be like a serrated line as well as like a curved line. Further, the meandering way includes an irregular or random shape as shown in FIG. 1, and a regular, geometric shape such as a crank shape as shown in, for example, FIG. 3.

A meandering way in a "random" or "irregular" shape means that a first cross-section perpendicular to the surface of the substrate has a first electrode outer surface shape that is different than a first electrode surface shape of any other cross-section parallel to the first cross-section. The first electrode outer surface shape refers to the surface of the first electrode opposite the inner surface of the first electrode that contacts the substrate surface (i.e. the outer surface of the first electrode is the surface that does not contact the substrate).

In other words, out of an infinite number of cross-sections parallel to each other across the electroluminescent element, any two cross-sections located any measurable distance from each other of the first electrode outer surface would have shapes that meander in different ways.

As detailed later, it is essential that above the surface having a multidimensionally meandering surface shape of the first electrode, an emissive layer of approximately 100 nm be uniformly formed. For the contribution of an increase in the effective light emitting area, it is necessary that the indented holes of the first electrode each have a hole diameter of at least twice as wide as the thickness of the emissive layer. Also, as detailed later, when forming a second electrode uniformly along the emissive layer, it is of course necessary that the diameter of the indented hole be wider than the addition of at least the thickness of the emissive layer and that of the second electrode. For that purpose, forming conditions such as the volume average particle size of the conductive powder used as a material of the first electrode, and the pressure at the time of the presswork need to be optimized in accordance with the organic electroluminescent material used, and with the set thickness of the emissive layer or the second electrode.

<Formation of Emissive Layer>

The organic electroluminescent material used was the compound poly(1,4-(2-(5-carboxypentyl)-phenylene)vinylene (hereinafter abbreviated as CP-PPV), one of polyphenyl vinylene derivatives, which are polymer electroluminescent materials. This compound is represented by the following Chemical Formula (1).

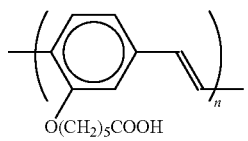

(1)

As represented by Chemical Formula (1), CP-PPV has in its side chain a carboxyl group as the functional group. The n in Chemical Formula (1) denotes a natural number of 2 or greater. This substance has a fluorescent color of yellow-green.

Figure 7:
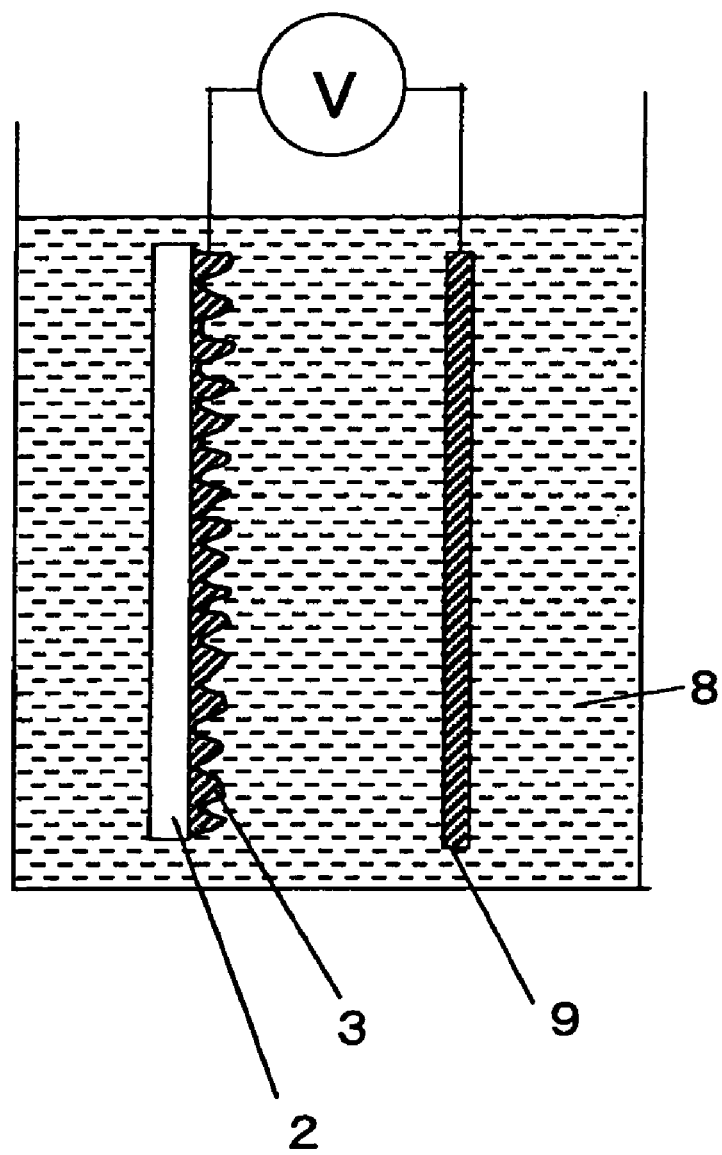
FIG. 7 is a view schematically showing the technique of electrolytic deposition.

As shown in FIG. 7, a solvent 8 of acetonitrile having CP-PPV of 0.02 M dense was prepared, and in this solvent the substrate 2 above which the first electrode 3 was formed was immersed. Further in the solvent, a platinum electrode 9 was immersed in such a way that it was parallel to the substrate 2 with a distance of 5 mm therebetween, followed by the application of a voltage of approximately 1.5 V between the platinum electrode 9 and the first electrode 3. The voltage was applied for fifteen minutes, and a CP-PPV layer of about 100 nm thick was deposited approximately uniformly by electrolytic deposition. After the fifteen minutes of application, the substrate having CP-PPV electrodeposited on the first electrode was pulled out and dried for one hour under a reduced pressure of 7999 Pa (60 mmHg) and 90° C., thus obtaining an emissive layer 4 that covered the first electrode 3 approximately uniformly. Formed to cover approximately uniformly the first electrode having a multidimensionally meandering surface shape, the emissive layer 4 has a multidimensionally meandering surface shape both on the surface facing the first electrode and the opposite surface. It should be noted that the conditions for the density of CP-PPV in the solvent, the voltage applied, and the period thereof are not limited to those mentioned above: they are open to adjustment in accordance with the desired thickness of the emissive layer.

The organic electroluminescent materials usable for forming the emissive layer by electrolytic deposition include organic materials that form colloids in the solvent, as well as ionizing materials such as the above CP-PPV. For example, among polythiophene derivatives, which are polymer electroluminescent materials, the compound poly(3-pentadecylthiophene) represented by Chemical Formula (2) below is dissolved in toluene so that the compound is 1 g/liter. In the toluene solution, acetonitrile is mixed at a volume ratio of one to nine (under the conditions of 25° C. and 101324.72 Pa). Thus, orange colloids are formed. Using this colloid solution and by electrolytic deposition illustrated in FIG. 7, the emissive layer is formed on the surface of the first electrode.

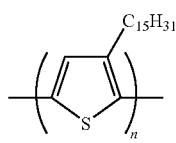

(2)

The n in Chemical Formula (2) denotes a natural number of 2 or greater.

Since the above advantageous effect is due to a structural change, i.e., due to an increase in the effective light emitting area, it is of course possible to use other organic electroluminescent materials, where the same advantageous effect is realized. Any other organic electroluminescent materials than polyphenyl vinylene and polythiophene above are usable as long as they exist as cations or anions in the solvent. Examples of such materials include those that have high molecular weight or about the same molecular weight as an oligomer and that have an anionic or cationic functional group, and also include known conductive electroluminescent materials of low molecular weight. For that reason, the fluorescent color of the electroluminescent material is not limited to yellow-green, on which color CP-PPV takes. To form an emissive layer of the desired thickness in accordance with the organic electroluminescent material used, it is of course necessary to optimize the solvent, the mixture ratio of the organic electroluminescent material and the solvent, the voltage applied, and the period thereof.

Examples of the solvent used for preparing the mixture solution containing a polymer electroluminescent material include, other than acetonitrile above, polar solvents of amine.

<Formation of Second Electrode>

Above the surface of the emissive layer 4 having a multidimensionally meandering surface shape, a conductive polymer film 5 serving as a hole-transfer layer was deposited by the same electrolytic deposition illustrated in FIG. 7 as the method of forming the emissive layer. The solution (tradename: Baytoron, available from Bayer) used contained, as the conductive polymer material to be electrodeposited, poly(ethylene-dioxythiophene)/polystyrene sulfonic acid (hereinafter abbreviated as PEDOT/PSS) that was dispersed in water. In this solution, PEDOT/PSS, serving as a conductive polymer, is charged in the form of colloid dispersed in the water with each particle sized in the order of submicrons. The use of such charged PEDOT/PSS in the form of colloid involves application of a current voltage of approximately 50 volts between, for example, the first electrode 3 and the platinum electrode 9 for five minutes. Thus, the conductive polymer film 5 of approximately 100 nm thick was deposited approximately uniformly above the emissive layer.

Further, in a solution in which finely powdered ITO (Indium Tin Oxide) with a volume average particle size of several tens of nanometers (available from, for example, Sumitomo Metal Mining Co., Ltd.) was dispersed in acetonitrile, a direct current voltage of approximately 50 volts was applied between the first electrode 3 and the platinum electrode 9 for ten minutes in the manner shown in FIG. 7. Thus, approximately uniformly above the conductive polymer film 5, a transparent second electrode of about 200 nm thick made of fine particles of ITO was deposited.

Next, the substrate above which the second electrode was formed was dried sufficiently. Further, in a dry atmosphere of nitrogen, a seal resin 7 was printed on the substrate 2 by screen printing, and a cell was completed by sealing it with a sealing plate 10. An extended electrode outside the sealing structure was provided each from the first electrode 2 and the second electrode 6 by using silver paste. If there was any space inside the cell, an inert gas (nitrogen) was filled therein at the time of sealing.

<Electroluminescent Characteristic of Organic Electroluminescent Element According to the Present Embodiment>

By the steps described above, the organic electroluminescent element shown in FIG. 1 was prepared. To study the electroluminescent characteristic of the organic electroluminescent element prepared, a direct current voltage of approximately 10 volts was applied to this organic electroluminescent element and to an organic electroluminescent element of conventional construction. This organic electroluminescent element of conventional construction was the same as that of the present embodiment except that the first electrode, the emissive layer made of PPV, and the second electrode were all flat layers. The organic electroluminescent element of conventional construction had a maximum luminance of approximately 1000 cd/m², whereas the organic electroluminescent element of the present embodiment had a maximum luminance of approximately 50000 cd/m², that is, fifty times as bright a maximum luminance as that of the organic electroluminescent element of conventional construction. This is speculated such that because of the formation of the approximately uniformly thick emissive layer having a multidimensionally meandering surface shape, the effective light emitting area of the organic electroluminescent element increased by fifty times.

The organic electroluminescent element of conventional construction and the organic electroluminescent element of the present embodiment were allowed to emit light continuously at an initial luminance of 1000 cd/m². The luminance half-reduction period of the organic electroluminescent element of conventional construction was approximately 1000 hours, whereas that of the organic electroluminescent element of the present embodiment was approximately 10000 hours. That is, it has been found that the lifetime of the organic electroluminescent element of the present invention is approximately ten times as long as that of the organic electroluminescent element of conventional construction.

[Increase in Effective Light Emitting Area of Emissive Layer]

The organic electroluminescent element prepared by the steps above was cut in three ways in accordance with the technique of FIB (Focused Ion Beam). These three ways of cutting were perpendicular to the substrate, and crossed each other at an angle of 60 degrees. The intersection point of them was the central point of the substrate. As a result, six segments were obtained. Of the six segments, six pairs of cut sections corresponding to one of the three ways of cutting were inspected by using a SEM (Scanning Electron Microscope). As a result, it was confirmed that the thickness of the formed emissive layer was approximately uniform. The term "cut section corresponding to one of the three ways of cutting" denotes either one of the two cut sections that result from one cutting and are the mirror images of each other.

Figure 8:
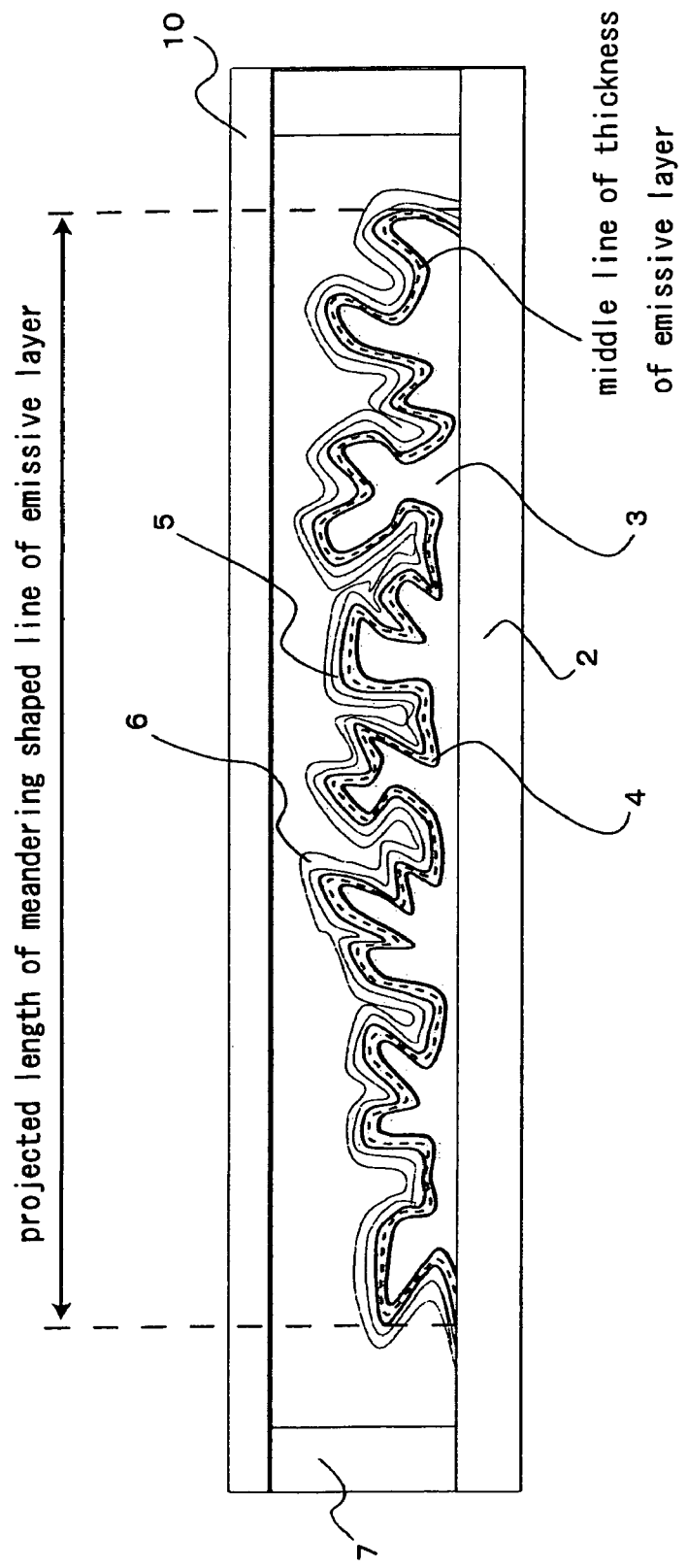
FIG. 8 is a view showing the projected length of the emissive layer.
Figure 9:
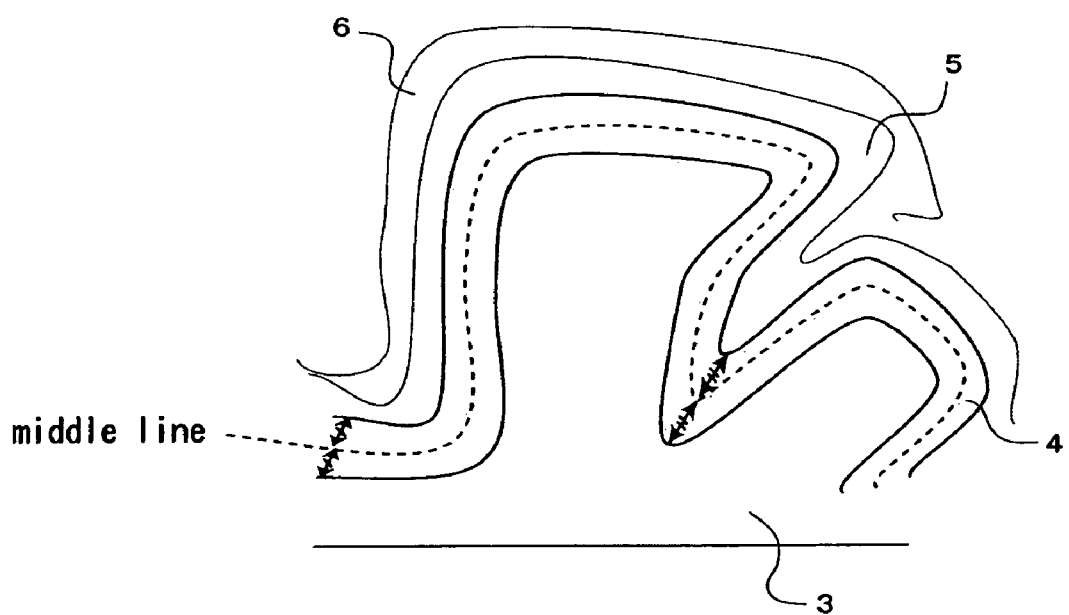
FIG. 9 is a view showing the actual length of the emissive layer.

As schematically shown in FIGS. 8 and 9, in each pair of cut sections corresponding to one way of cutting, the actual length and projected length of the meandering-shaped line of the emissive layer were determined by calculation. As shown in FIG. 9, the actual length of the meandering-shaped line determined by calculation was the middle line (broken lines in FIGS. 8 and 9) that was determined by the border line of the emissive layer 4 and the first electrode 3, and by the border line of the emissive layer 4 and the conductive polymer film 5 (replaced by the second electrode when it was provided directly on the emissive layer). As shown in FIG. 8, the projected length of the meandering-shaped line of the emissive layer determined by calculation was the length of the meandering-shaped line that was projected onto a plane parallel to the substrate and projected from a direction perpendicular to the substrate.

It was confirmed that the results of these calculations meet the following Inequality (1).

$$\frac{\sum_{n=1}^{6}\left(\begin{array}{c}\text{actual length of meandering}\\ \text{shaped line of } n\text{th cut section}\end{array}\right)}{6} \geq 2 \quad (1)$$

According to the empirical studies by the present inventors, the value obtained is well beyond the value obtained when using a flat or coarse substrate. The value becomes greater as the element has a better electroluminescent characteristic described above. To obtain an excellent electroluminescent characteristic, the average value of the ratio above is preferably three times as large, more preferably five times as large, further more preferably ten times as large, and particularly preferably twenty times as large as the right part. In the present embodiment, the effective light emitting area has been found to increase by more than thirty times as compared with the prior art example above.

Embodiments of Second Invention Group

The following describes the contents and preferred embodiments of a device having, above the substrate, one or plurality of organic electroluminescent elements of the second invention group of the present invention.

<Display Device>

Figure 10:
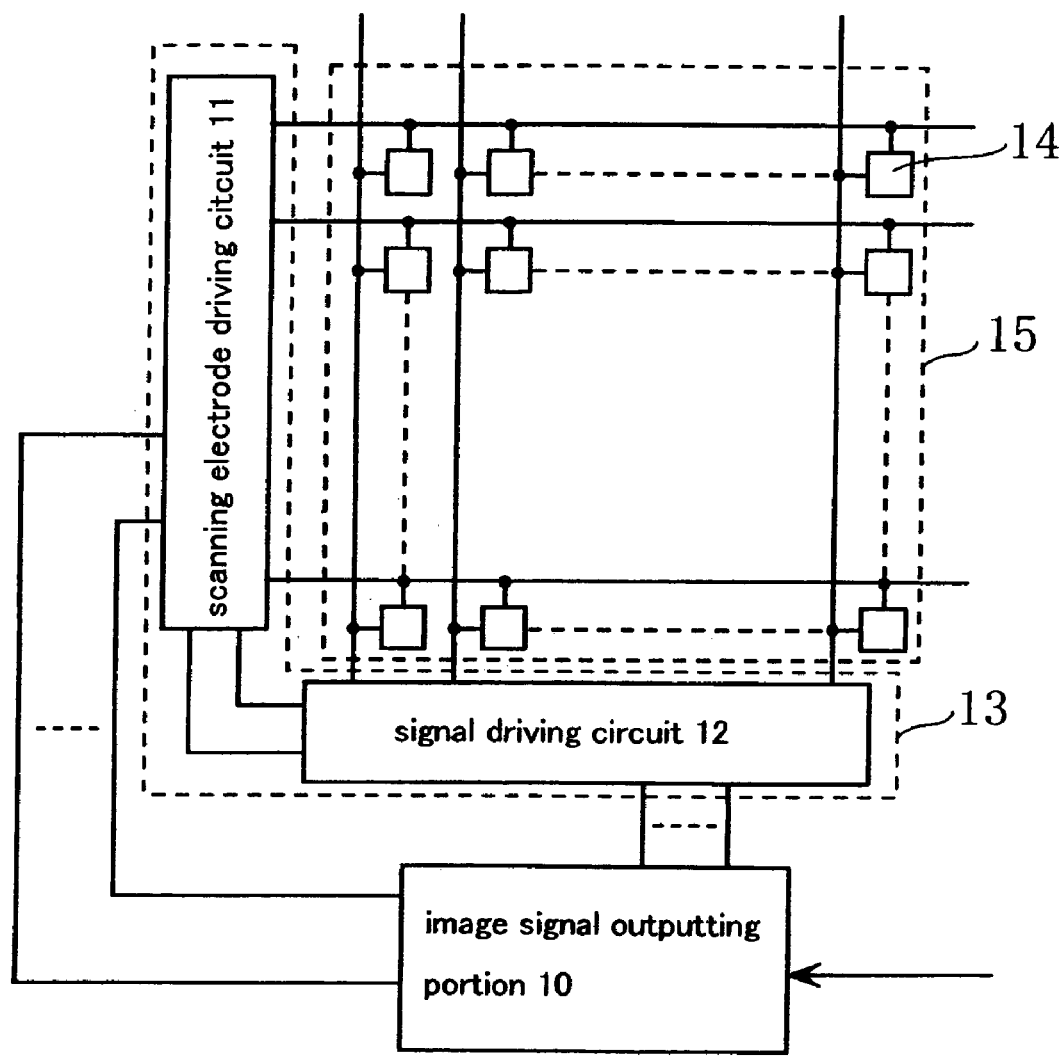
FIG. 10 is a schematic view of an example of a display device using an organic electroluminescent element according to the present invention.

FIG. 10 is a schematic view of an example of a display device using the organic electroluminescent element above. The display device of this example has an image signal outputting portion 10 for generating an image signal, an electron circuit 13 formed on the substrate and having a scanning electrode driving circuit 11 for generating an image signal from the image signal outputting portion and a signal driving circuit 12, and an electroluminescent portion 15 aligned in a matrix of 100×100 and having an organic electroluminescent element 14 whose light emission is controlled by the electron circuit 13. The electroluminescent portion 15 is composed of the organic electroluminescent element of the first invention group. Such display device has been confirmed to display images with high brightness and stability over a long period, as compared with a display device having an organic electroluminescent element of conventional construction.

<Lighting System>

Figure 11:
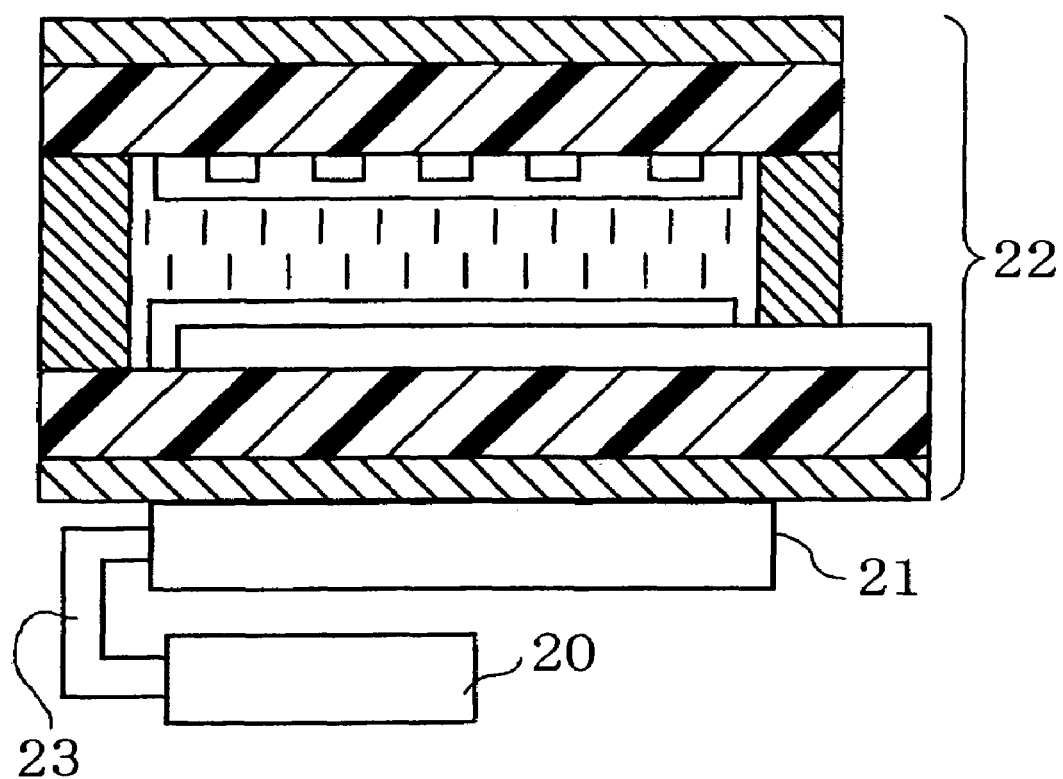
FIG. 11 is a schematic view of an example of a lighting system using an organic electroluminescent element according to the present invention.

FIG. 11 is a schematic view of an example of a lighting system using the organic electroluminescent element above. The lighting system of this example has a driving portion 20 for controlling a current, and an electroluminescent portion 21 electrically connected with a voltage application wire 23 formed on the substrate and having a group of organic electroluminescent elements for emitting light in accordance with a current output from the driving portion. The electroluminescent portion 21 is composed of a group of the organic electroluminescent elements of the first invention group formed on the substrate, and in this example, is used as the back light of a liquid crystal display panel 22, as shown in FIG. 11. Such lighting system has been confirmed to realize highly bright light emission over a long period, as compared with a lighting system having an organic electroluminescent element of conventional construction.

<Miscellaneous>

(a) In the present invention, the per unit effective light emitting area of the emissive layer made of an organic substance remarkably increases. Accordingly, even if the per-unit-area amount of current injected in the emissive layer is decreased, the total per-unit-area amount of light emitted from the organic electroluminescent element remarkably increases. To increase the effective light emitting area of the emissive layer, the emissive layer needs to be formed along the first electrode. The conductive polymer film, serving as a hole-transfer layer, and the second electrode are preferably formed uniformly along the emissive layer, because if so, an electric field is applied uniformly to each of the layer structures, as shown in FIG. 1. These films, however, have low values of resistance, and therefore the organic electroluminescent element may be such that a nonuniformly thick conductive polymer film covers the first electrode, and a second electrode having a flat surface is provided on them. In this case as well, it has been confirmed that the effective light emitting area increases, remarkably improving the electroluminescent efficiency of the element.

(b) The method of forming the emissive layer above the first electrode is not limited to electrolytic deposition described above: any other methods are usable as long as they can deposit an organic substance uniformly above the electrodes. Examples of other preferred methods include the technique of heat CVD (Chemical Vapor Deposition) that involves a relatively high voltage. With this method, an organic substance is easy to disperse uniformly around the object, that is, around the surface of a complicated structure such as an indented hole. Other than heat CVD, the following method can be employed. A vacuum vessel heated beyond the boiling point of the organic substance to be used is filled with the organic substance sublimed by heating, and the temperature of a substrate disposed within the vessel is adjusted below the boiling point of the organic substance. With this method as well, the organic substance is attached uniformly to the indented holes on the surface of the first electrode formed on the substrate. Thus, as the method of forming films on the object having a multidimensionally meandering surface shape of the present invention, methods that excel in dispersing molecules, such as those that allow the object to adsorb dispersed organic molecules, are preferred to such methods as vacuum evaporation used for preparing conventional organic ELs, where molecules are linearly directed to the object.

(c) In the present embodiment, although powdered calcium has been used to form the first electrode, any conductive powder may be used as the constituent of the first electrode. However, to improve electron injection, alkaline-earth metals such as calcium and magnesium are preferred.

(d) In the present embodiment, although emitted light has been extracted from the surface opposite to the first-electrode-formed surface of the substrate, light may be extracted from the first-electrode-formed surface of the substrate. In this case, the substrate above which the first electrode is formed and the second electrode are light-permeable. As for the sealing substrate for sealing the organic electroluminescent element, such substrate need not be transparent. In place of the sealing substrate, a sealing can made of aluminum or the like may be used to realize a dampproof structure.

Specifically, the first electrode may be made of ITO and the second electrode may be made of a calcium electrode. The organic electroluminescent element resulting from this construction allows light to be extracted from the first-electrode-formed surface of the light-permeable substrate.

Alternatively, sol-gel processing that sinters hydroxides of indium or stannous may be employed so that a transparent electrode having a multidimensionally meandering surface shape and made of ITO is formed.

(e) In the present embodiment, the conductive polymer film was provided between the emissive layer and the second electrode. However, the conductive polymer film may not necessarily be formed: the second electrode may be provided directly on the emissive layer (on the surface opposite to the other surface facing the substrate).

(f) In the present embodiment, the emissive layer was provided directly on the first electrode. However, it is of course possible to provide a conductive polymer film as an electron-transport layer or hole-transfer layer between the first electrode and the emissive layer.

INDUSTRIAL APPLICABILITY

As has been described above, in the present invention, the emissive layer of the organic electroluminescent element has a multidimensionally meandering surface shape and is formed above the surface of the first electrode. This increases the per unit effective light emitting area of the organic electroluminescent element, improving the luminance and durability thereof. Also, the use of the organic electroluminescent element of the present invention as a pixel provides a display device with improved luminance and durability. Further, the use of the organic electroluminescent element of the present invention as a light source provides a lighting system with improved luminance and durability.

What is claimed is:

1. An organic electroluminescent element comprising:
 a substrate having a first surface;
 a first electrode located above the first surface of the substrate, the first electrode having a first surface adjacent to the substrate and second surface opposite the first surface;
 an emissive layer including an organic electroluminescent material, the emissive layer located on the second surface of the first electrode and having a first surface adjacent to the first electrode and a second surface opposite the first surface; and
 a second electrode located on the second surface of the emissive layer;
 wherein the organic electroluminescent element is viewed as intersected by an imaginary first plane perpendicular to the first surface of the substrate and a plurality of imaginary second planes parallel to the first plane, such that every one of such plurality of imaginary second planes is spaced from such first plane, and such first plane and second planes define a first cross-section, corresponding to the first imaginary plane, and a plurality of second cross-sections, corresponding to the plurality of imaginary second planes, of the organic electroluminescent element, the second surface of the first electrode having a multidimensionally meandering surface shape such that:
  such a first cross-section of the second surface of the first electrode meanders,
  every second cross-section of the second surface of the first electrode meanders in a way that differs from the meandering shape of the first cross-section, and
  the first and second cross-sections meander in directions other than perpendicular to the substrate; and
 wherein the first and second surfaces of the emissive layer have a multidimensionally meandering surface shape such that:

such a first cross-section of the emissive layer meanders,
every second cross-section of the emissive layer meanders in a way that differs from the meandering shape of the first cross-section, and
the first and second cross-sections of the emissive layer meander in directions other than perpendicular to the substrate.

2. The organic electroluminescent element according to claim 1, wherein a thickness of the emissive layer is uniform.

3. The organic electroluminescent element according to claim 2, wherein:
in each of six pairs of cross-sections of the organic electroluminescent element resulting from three ways of cutting thereof, an actual length of a meandering-shaped line of the emissive layer and a projected length of the meandering-shaped line meet the following Inequality 1, the three ways of cutting being perpendicular to the substrate and crossing each other at an angle of 60 degrees and at an arbitrary intersection point on the substrate, the projected length of the meandering-shaped line being a length of the meandering-shaped line projected onto a plane parallel to the substrate and projected from a direction perpendicular to the substrate:

$$\frac{\sum_{n=1}^{6}\left(\begin{array}{c}\text{actual length of meandering}\\ \text{shaped line of } nth \text{ cut section}\end{array}\right)}{\text{(its projected length)}} \geq 2. \quad (1)$$

4. The organic electroluminescent element according to claim 1, wherein a first surface of the second electrode faces the emissive layer and has a multidimensionally meandering surface shape such that:
such a first cross-section of the first surface of the second electrode meanders,
every second cross-section of the first surface of the second electrode meanders in a way that differs from the meandering shape of the first cross-section, and
the first and second cross-sections meander in directions other than perpendicular to the substrate.

5. A method of fabricating an organic electroluminescent element comprising:
preparing a substrate having a first surface;
forming a first electrode above the substrate, the first electrode having a first surface adjacent to the first surface of the substrate and a second surface opposite the first surface of the first electrode;
forming an emissive layer above the second surface of the first electrode; and
forming a second electrode above the emissive layer;
wherein the first electrode is formed by any of the following methods (A) to (D):
(A) dissolving and solidifying metal in an inert gas;
(B) removing a removable fiber from a lump of metal in which the removable fiber is mixed;
(C) etching the surface of a lump of metal; or
(D) pressure forming finely powdered metal;
wherein the organic electroluminescent element is viewed as intersected by an imaginary first plane perpendicular to the first surface of the substrate and a plurality of imaginary second planes parallel to the first plane, such that every one of such plurality of imaginary second planes is spaced from such first plane, and such first plane and second planes define a first cross-section, corresponding to the first imaginary plane, and a plurality of second cross-sections, corresponding to the plurality of imaginary second planes, of the organic electroluminescent element,
and wherein the second surface of the first electrode has a multidimensionally meandering surface shape such that:
such a first cross-section of the second surface of the first electrode meanders,
every second cross-section of the second surface of the first electrode meanders in a way that differs from the meandering shape of the first cross-section, and
the first and second cross-sections meander in directions other than perpendicular to the substrate; and
wherein the emissive layer has a multidimensionally meandering surface shape such that:
such a first cross-section of the emissive layer meanders,
every second cross-section of the emissive layer meanders in a way that differs from the meandering shape of the first cross-section, and
the first and second cross-sections of the emissive layer meander in directions other than perpendicular to the substrate.

6. The method of fabricating an organic electroluminescent element according to claim 5, wherein the organic electroluminescent material is deposited uniformly along the multidimensionally meandering surface of the first electrode by means of electrolytic deposition.

7. A display device comprising:
a substrate;
an electronic circuit formed on the substrate; and
at least one organic electroluminescent element, light emission thereof being controlled via the electronic circuit, the organic electroluminescent element comprising:
a substrate having a first surface;
a first electrode located above the substrate and having a first surface adjacent to the first surface of the substrate and a second surface opposite the first surface of the first electrode;
an emissive layer including an organic electroluminescent material, the emissive layer formed along the second surface of the first electrode; and
a second electrode located above the emissive layer;
wherein the organic electroluminescent element is viewed as intersected by an imaginary first plane perpendicular to the first surface of the substrate and a plurality of imaginary second planes parallel to the first plane, such that every one of such plurality of imaginary second planes is spaced from such first plane, and such first plane and second planes define a first cross-section, corresponding to the first imaginary plane, and a plurality of second cross-sections, corresponding to the plurality of imaginary second planes, of the organic electroluminescent element,
the second surface of the first electrode has a multidimensionally meandering surface shape such that:
such a first cross-section of the second surface of the first electrode meanders,
every second cross-section of the second surface of the first electrode meanders in a way that differs from the meandering shape of the first cross-section, and
the first and second cross-sections meander in directions other than perpendicular to the substrate; and wherein the emissive layer has a multidimensionally meandering surface shape such that:
such a first cross-section of the emissive layer meanders,
every second cross-section of the emissive layer meanders in a way that differs from the meandering shape of the first cross-section, and
the first and second cross-sections of the emissive layer meander in directions other than perpendicular to the substrate.

8. A lighting system comprising a substrate, a voltage application wire located on the substrate, and at least one organic electroluminescent element electrically connected with the voltage application wire, the organic electroluminescent element comprising:

a substrate having a first surface;
a first electrode located above the substrate, the first electrode having a first surface adjacent to the first surface of the substrate and a second surface opposite the first surface of the first electrode;
an emissive layer including an organic electroluminescent material, the emissive layer formed along the second surface of the first electrode; and
a second electrode located above the emissive layer;
wherein the organic electroluminescent element is viewed as intersected by an imaginary first plane perpendicular to the first surface of the substrate and a plurality of imaginary second planes parallel to the first plane, such that every one of such plurality of imaginary second planes is spaced from such first plane, and such first plane and second planes define a first cross-section, corresponding to the first imaginary plane, and a plurality of second cross-sections, corresponding to the plurality of imaginary second planes, of the organic electroluminescent element,
the second surface of the first electrode has a multidimensionally meandering surface shape such that:
such a first cross-section of the second surface of the first electrode meanders, the cross-section being perpendicular to the first surface of the substrate,
every second cross-section of the second surface of the first electrode meanders in a way that differs from the meandering shape of the first cross-section, and
the first and second cross-sections meander in directions other than perpendicular to the substrate; and
wherein the emissive layer has a multidimensionally meandering surface shape such that:
such a first cross-section of the emissive layer meanders,
every second cross-section of the emissive layer meanders in a way that differs from the meandering shape of the first cross-section, and
the first and second cross-sections of the emissive layer meander in directions other than perpendicular to the substrate.

* * * * *